United States Patent [19]

Garinger et al.

[11] Patent Number: 5,465,339
[45] Date of Patent: Nov. 7, 1995

[54] DECOUPLED REFRESH ON LOCAL AND SYSTEM BUSSES IN A PC/AT OR SIMILAR MICROPROCESSOR ENVIRONMENT

[75] Inventors: Ned Garinger; Joseph A. Thomsen, both of Chandler; Jeffery M. Michelsen, Mesa, all of Ariz.

[73] Assignee: VLSI Technology, Inc., San Jose, Calif.

[21] Appl. No.: 661,785

[22] Filed: Feb. 27, 1991

[51] Int. Cl.$^6$ .................................................. G06F 12/16
[52] U.S. Cl. .................. 395/433; 364/246.91; 364/964.9
[58] Field of Search ................................... 364/200, 900; 395/400, 425; 365/222

[56] References Cited

U.S. PATENT DOCUMENTS

| | | | |
|---|---|---|---|
| 4,028,675 | 6/1977 | Frankenberg | 365/222 |
| 4,106,108 | 8/1978 | Cislaghi et al. | 365/222 |
| 4,185,323 | 1/1980 | Johnson et al. | 365/222 |
| 4,317,169 | 2/1982 | Panepinto, Jr. et al. | 395/425 |
| 4,333,167 | 6/1982 | McElroy | 365/222 |
| 4,459,660 | 7/1984 | Bellay et al. | 365/222 |
| 4,581,720 | 4/1986 | Takemae et al. | 365/222 |
| 4,625,301 | 11/1986 | Berger | 365/222 |
| 4,628,482 | 12/1986 | Tachiuchi et al. | 365/222 |
| 4,631,701 | 12/1986 | Kappeler et al. | 365/222 |
| 4,723,204 | 2/1988 | Khera | 364/200 |
| 4,725,987 | 2/1988 | Cates | 365/220 |
| 4,796,232 | 1/1989 | House | 365/189 |
| 4,884,234 | 11/1989 | Keys et al. | 364/900 |
| 4,914,630 | 4/1990 | Fujishima et al. | 365/189.04 |
| 4,918,650 | 4/1990 | De Wolf | 364/900 |
| 4,933,845 | 6/1990 | Hayes | 395/325 |
| 4,954,951 | 9/1990 | Hyatt | 395/425 |
| 4,965,717 | 10/1990 | Cutts, Jr. et al. | 395/425 |
| 4,965,722 | 10/1990 | Tokuume | 395/425 |
| 4,987,529 | 1/1991 | Craft et al. | 395/325 |
| 5,345,577 | 9/1994 | Chan et al. | 395/425 |

*Primary Examiner*—Reba I. Elmore
*Attorney, Agent, or Firm*—Burns, Doane, Swecker & Mathis

[57] ABSTRACT

A microchip circuit for use in and method for use with PC/AT microprocessor environments enables both local memory and ISA bus memory to be refreshed while reducing CPU overhead time entailed in a performing refresh by providing decoupled refresh cycles for the local memory and the ISA memory.

3 Claims, 2 Drawing Sheets

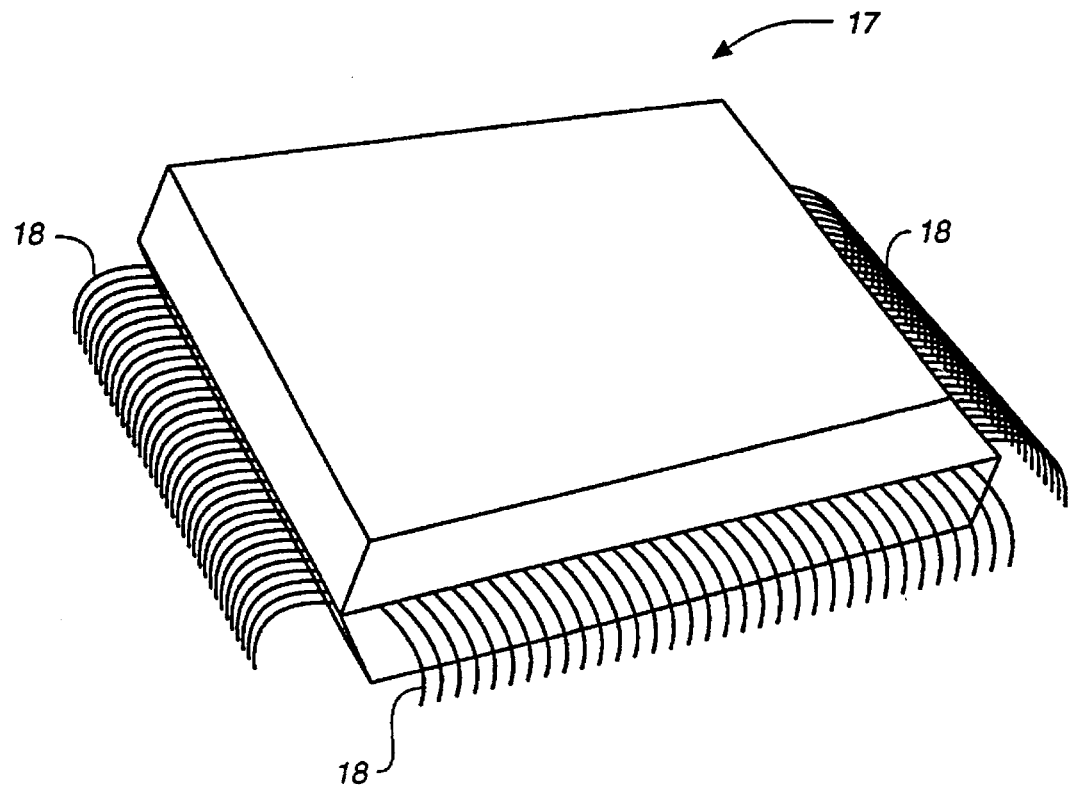
FIG._1
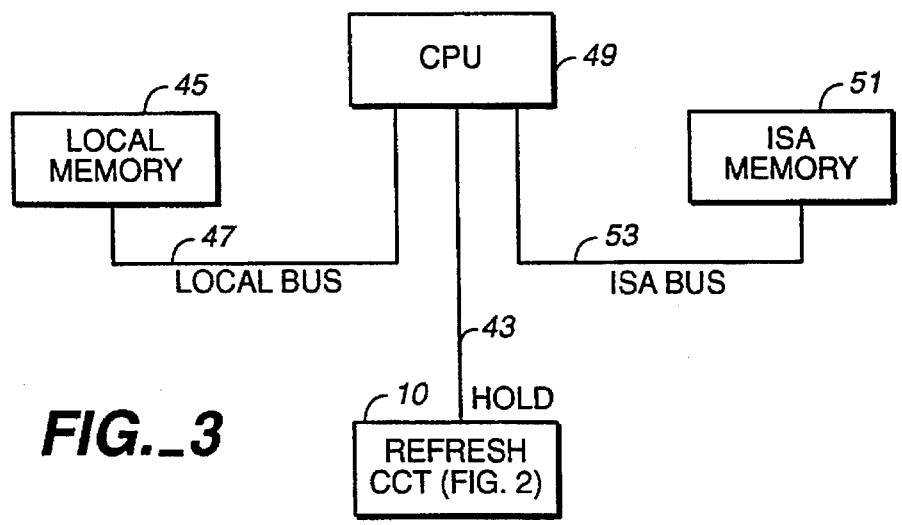
FIG._3

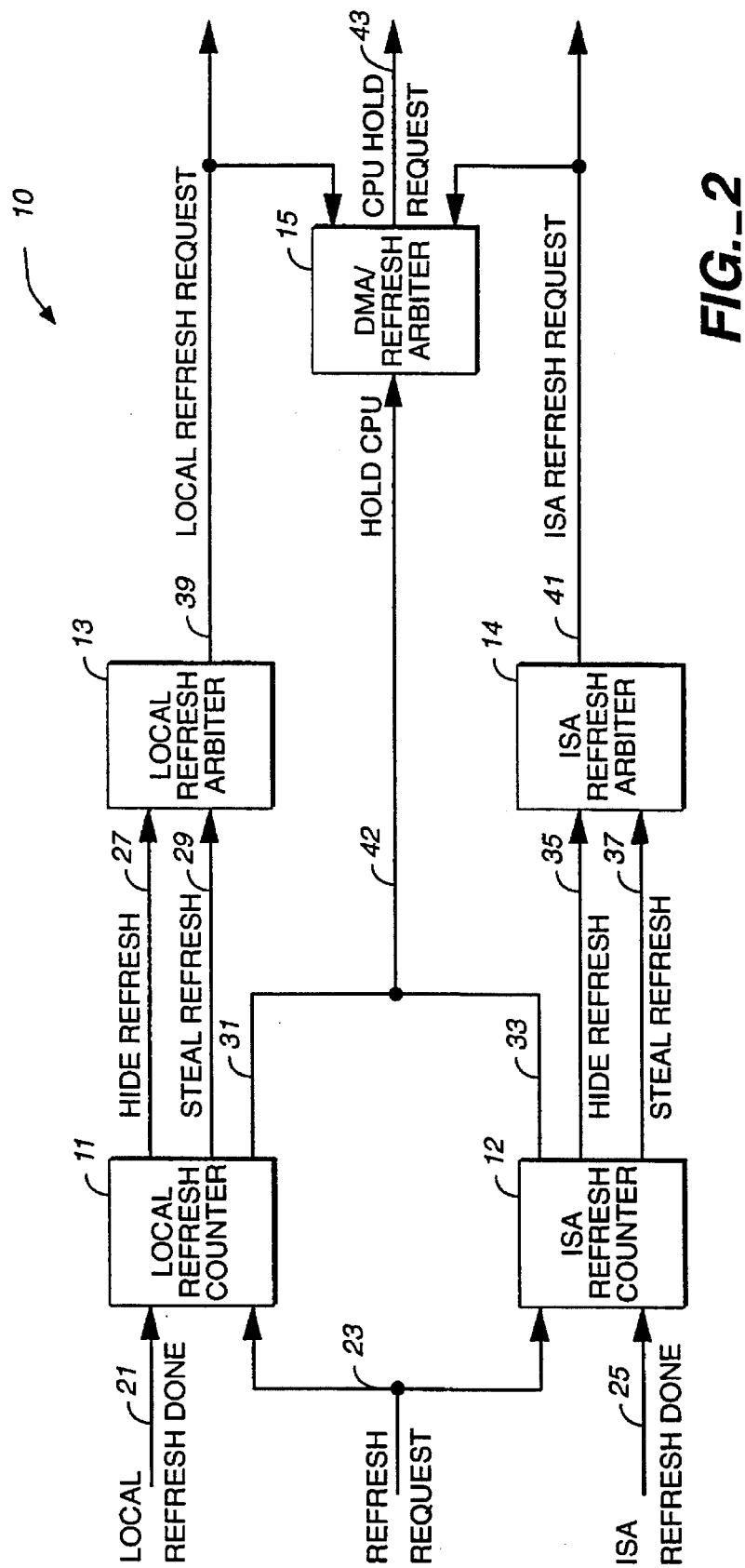
FIG._2

5,465,339

DECOUPLED REFRESH ON LOCAL AND SYSTEM BUSSES IN A PC/AT OR SIMILAR MICROPROCESSOR ENVIRONMENT

INTRODUCTION

The present invention relates generally to a new and improved chip for use in a computer and more particularly to a circuit within that chip, which implements a method of operation that reduces the impact of memory refresh on CPU performance within a PC/AT microprocessor environment, by reducing the amount of CPU time required to handle DRAM refreshes.

BACKGROUND OF THE INVENTION

Dynamic Random Access Memory (DRAM) can lose through decay, the charge that defines the value held within it. Therefore, it is necessary to periodically generate a pulse along the memory bus to "refresh" these charges held by the DRAM.

BRIEF SUMMARY OF THE INVENTION

The present invention concerns a very large scale integration (VLSI) circuit as part of an electronic controller chip which has as its principle application improving personal computer and primarily those microcomputers known as "PC/AT" compatible. In PC/AT type computers, the CPU has been required to perform both local memory and ISA bus memory refreshes simultaneously. This invention improves the effective performance of the CPU by reducing the amount of central processor unit (CPU) overhead time required to refresh both local memory and that on the Industry Standard Architecture (ISA) bus by employing a method utilizing decoupled refresh cycles.

Prior art requires the CPU to perform both local memory refreshes and ISA bus refreshes simultaneously. To accomplish this, however, the CPU was forced to pause from its other activities and take over the system in order to perform the refresh. Thus, the prior art refresh methodology takes the CPU away from its computing activities and results in approximately a 10% overhead performance penalty on the CPU. Also, refreshes performed in this manner make it difficult to run the local bus asynchronously from the ISA bus. The present invention is directed to overcoming these shortcomings with a device that allows for decoupling refreshes to the two busses and which allows, refresh to occur on a particular bus while the CPU is accessing the other bus.

More particularly, the present invention comprises a circuit within a VLSI controller chip which is comprised of counters, arbiter devices and signal generators. This circuit determines when and how to perform refresh operations on the internal and ISA busses so as to minimize the time lost by the CPU from computing operations.

The present invention decouples the internal and ISA buses thereby removing a major obstacle to operating the buses asynchronously. A refresh to memory on one bus can be accomplished while an access to the other bus is being carried out. Also, a method is embodied that allows a refresh to a bus to occur immediately following an access to that bus. The present invention performs either of these activities without having to stop and restart the CPU in the manner of prior art. Additionally, when necessary, memory refreshes can also be performed in the same manner as in the prior art. The result is a device implementing a process which minimize CPU refresh overhead and thereby improves CPU performance.

Accordingly, a primary object of the present invention is to provide novel means and methods for minimizing the performance overhead penalty imposed on CPU operation by conventional memory refreshes.

Another object of the present invention is to provide a new and improved decoupled refresher for micro-computer systems which enables one bus to be refreshed while a second bus is productively engaged.

A further object of the present invention is to provide means and methods for obtaining refresh of a bus immediately following access to that bus and without stopping and restarting the CPU.

These and still further objects as shall hereinafter appear are readily fulfilled by the present invention in a remarkably unexpected manner, as will be readily discerned from the following detailed description of an exemplary embodiment thereof, especially when read in conjunction with the accompanying drawings in which like parts bear like indicia throughout the several views.

BRIEF DESCRIPTION OF THE DRAWINGS

In the drawing:

FIG. 1 is photograph of VLSI System controller chip embodying the present invention as a circuit therewithin;

FIG. 2 is a block diagram of a decoupled refresh circuit embodying the present invention; and FIG. 3 is a simplified block diagram of a portion of a PC/AT computer system.

DESCRIPTION OF THE PREFERRED EMBODIMENT

The decoupled refresh controller of the present invention comprises a circuit disposed within a VLSI controller chip 17 such as that shown in FIG. 1. Around the perimeter of the controller chip 17 are pins 18 that allow the transmission/reception of electronic signals between chip 17 and the other chips in a PC/AT set, with memory, second with peripheral devices via the ISA bus within the computer.

Referring to FIG. 3, in order to minimize the performance overhead imposed on CPU (49) performance by refreshes to the local memory through the internal bus (47) and ISA memory (51) through the ISA bus (53), the present invention employs a circuit (10) permitting local bus refreshes during accesses to the ISA bus and refreshes to the ISA bus during local memory accesses. These are called hidden refreshes since they impose no performance overhead upon the CPU as the refresh occurs through an otherwise unutilized bus.

Refreshes must be made within time limits set by the specifications of the memory used. The optimum situation provided by hidden refreshes can only be obtained if there are accesses made to each bus within the time set by the refresh specifications which are external to the invention, and set by the need to avoid information loss. Generally, the internal bus can be expected to have more accesses than the ISA bus as prudent architecture dictates a greater use of internal memory rather than ISA memory. However, it is possible for either bus to be accessed nearly exclusively for a period of time approaching the specified limits for refresh. If only the hidden refresh method were available, then information could be lost from memory not refreshed as such information is lost as the charge is lost. The present invention handles this situation by providing another refresh method called a stolen refresh.

A stolen refresh is a refresh request that is appended to the last access to a given bus. A stolen refresh does result in some overhead being imposed on CPU operation. However, a stolen refresh does not impose the same refresh overhead on CPU performance as does a standard refresh. First, time is not taken to halt and restart the CPU, as occurs during a standard refresh. Secondly, the internal bus operates faster than the ISA and more accesses are generally made to the internal memory. Thus, stolen refreshes will most often be done to this faster bus requiring less time than a standard refresh which has been tied to the speed of the slowest bus refreshed and restarted.

Another function of the present invention arises when the CPU has not made an access to either bus for a time approaching specified refresh limits. In this event, the present invention will perform a standard refresh to both busses in the same manner as is well known in prior art.

Optimization of CPU performance by minimizing the overhead penalty imposed on the CPU by refresh operations is accomplished by the present invention by a device described below which determines which type of refresh is required, namely, hidden, stolen, or standard, and then automatically performing the appropriate refresh operation. To aid in a more complete understanding of the operation of the present invention, reference should be made to the Signal Descriptions set forth in Table I, below and to FIG. 2.

TABLE I

| SIGNAL | DESCRIPTION |
| --- | --- |
| CPU HOLD REQUEST | Signal generated by DMA/refresh arbiter to cause the CPU to halt operation in order to start a standard refresh cycle. |
| HIDE REFRESH | Signal generated by either the local refresh counter or ISA refresh request signal which signal is received by the corresponding refresh arbiter. |
| HOLD CPU | Signal generated by either the local refresh counter or ISA refresh counter when a refresh request count reaches a preselected number. |
| ISA REFRESH DONE | Signal generated following an ISA refresh cycle and received by the ISA refresh counter causing its refresh request count to decrement by one. |
| ISA REFRESH REQUEST | Signal generated by the ISA refresh arbiter in response to either a HIDE REFRESH signal or STEAL REFRESH signal when the corresponding type of refresh request can be performed. |
| LOCAL REFRESH DONE | Signal received by the local refresh counter causing its refresh request count to decrement by one. |
| LOCAL REFRESH REQUEST | Signal generated by the local refresh arbiter in response to either a HIDE REFRESH signal or STEAL REFRESH signal when the corresponding type of refresh requested can be performed. |
| REFRESH REQUEST | Signal received by both the ISA and local refresh counters causing the refresh request counts in each to increment by one. |
| STEAL REFRESH | Signal generated by a refresh counter and received by the corresponding refresh arbiter indicating that at least a first preselected number, e.g. five, and less than a second preselected number, e.g. seven, refresh requests are pending. |

In one practice of the present invention, a decoupled refresh starts when a REFRESH REQUEST (23) occurs. This causes both the ISA refresh counter 12 and local refresh counter 11 to increment and assert the HIDE REFRESH signals (27,35) indicating that a refresh is pending. If the next access is a local memory access the local refresh arbiter 13 will prevent LOCAL REFRESH REQUEST (39) from going active, while the ISA refresh arbiter 14 will assert the ISA REFRESH REQUEST (41). After the ISA refresh is completed ISA REFRESH DONE (25) will pulse causing the ISA refresh counter 12 to decrement and HIDE REFRESH (35) from that counter to go inactive. If five more REFRESH REQUESTS (23) occur without an ISA bus cycle then STEAL REFRESH from the local refresh counter 11 will go active. The local refresh arbiter 13 will then append a local memory refresh to the end of the current memory cycle before telling the CPU that the cycle is completed. When the LOCAL REFRESH DONE signal (21) pulses, at the end of the local memory refresh, the local refresh counter 11 will be decremented and STEAL REFRESH (29) goes inactive.

Exactly the reverse of the above cycle occurs when the CPU is accessing the ISA bus continually. Thus, during the operation of an actual system there will be a mix of both stolen and hidden refreshes occurring on both the local bus and the ISA bus.

If seven refreshes are ever pending in either refresh counter 11 or 12, MOLD CPU (42) will be generated by the appropriate counter and a standard refresh will be initiated by the DMA/refresh arbiter 15 beginning with a CPU HOLD REQUEST (43) issued to the CPU unless the CPU was not already being held by another command situation such as a request by the DMA controller or a bus master. As soon as the CPU acknowledges that it is being held, whether as a result of the refresh hold request or in response to a pre-existing command, then refreshes will be performed on both the local bus and ISA bus. When the refreshes are completed, both refresh counters, 11 and 12 are decremented and the hold request to the CPU is removed. Usually, this situation occurs only when the CPU had been sitting idle for an extended period of time.

Most refreshes performed by the present invention are either hidden or stolen refreshes, neither of which result in loss of CPU (42) performing under the hierarchy of commands employed therein. Note that a HOLD CPU command takes preference over other CPU commands to prevent the loss of the information stored in the DRAM.

From the foregoing, it becomes apparent that new and useful means and methods have been herein described and illustrated which fulfill all of the aforestated objectives in a remarkably unexpected fashion. It is, of course, understood that such modifications, alterations, and adaptations as may readily occur to an artisan having the ordinary skills to which this invention pertains are intended within the spirit of the present invention which is limited only by the scope of the claims appended hereto.

Accordingly what is claimed is:

1. In a computer having a first memory connected to a first bus connected to a CPU and a second memory connected to a second bus connected to said CPU, a memory refresh device comprising:

first means for receiving a refresh request signal and generating in response thereto a first signal indicating that at least one refresh request for said first memory is pending, for generating a third signal in lieu of said first signal when a first predetermined number of refresh requests for said first memory are pending, and for generating a fifth signal in lieu of both said first and third signals when a third predetermined number, larger than said first predetermined number, of refresh requests for said first memory are pending;

first responsive means responsive to said first signal for causing a refresh operation of said first memory to be performed as said first memory becomes available for refresh and responsive to said third signal for causing a refresh operation of said first memory to be performed in prolongation of a current access of said first memory without the first bus being relinquished for a subsequent access;

second means for receiving said refresh request signal and generating in response thereto a second signal indicating that at least one refresh request for said second memory is pending, for generating a fourth signal in lieu of said second signal when a second predetermined number of refresh requests for said second memory are pending, and for generating a sixth signal in lieu of both said second and fourth signals when a fourth predetermined number, larger than said second predetermined number, of refresh requests for said second memory are pending;

second responsive means responsive to said second signal for causing a refresh operation of said second memory to be performed as said second memory becomes available and responsive to said fourth signal for causing a refresh operation of said second memory to be performed in prolongation of a current access of said second memory without the bus being relinquished for a subsequent access; and means connected to said CPU and responsive to assertion of either of said fifth signal or said sixth signal for requesting that said CPU be placed in a hold state while said first and second responsive means cause said first and second memories to be refreshed.

2. The device of claim 1 wherein said computer is of the PC/AT type.

3. The device of claim 1 wherein one of bus is a local bus, and the other of said buses is a ISA bus.

* * * * *